United States Patent
Xiao

(10) Patent No.: US 10,607,561 B2
(45) Date of Patent: Mar. 31, 2020

(54) VOLTAGE CALIBRATION METHOD AND CALIBRATION SYSTEM BASED ON TIMING CONTROLLER

(71) Applicant: Shenzhen China Star Optoelectronics Technology Co., Ltd., Shenzhen, Guangdong (CN)

(72) Inventor: Guangxing Xiao, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 190 days.

(21) Appl. No.: 15/754,525

(22) PCT Filed: Jan. 24, 2018

(86) PCT No.: PCT/CN2018/073981
§ 371 (c)(1),
(2) Date: Feb. 22, 2018

(87) PCT Pub. No.: WO2019/127781
PCT Pub. Date: Jul. 4, 2019

(65) Prior Publication Data
US 2019/0385562 A1    Dec. 19, 2019

(30) Foreign Application Priority Data
Dec. 29, 2017    (CN) .......................... 2017 1 1484040

(51) Int. Cl.
*G09G 3/36*    (2006.01)
*G05F 1/46*    (2006.01)
*H03M 1/12*    (2006.01)

(52) U.S. Cl.
CPC ............ *G09G 3/3696* (2013.01); *G05F 1/462* (2013.01); *H03M 1/12* (2013.01); *G09G 2310/0289* (2013.01); *G09G 2310/08* (2013.01)

(58) Field of Classification Search
CPC ......... G09G 3/3696; G09G 2310/0289; G09G 2310/08; H03M 1/12; G05F 1/462
See application file for complete search history.

(56) References Cited

U.S. PATENT DOCUMENTS

| | | | | |
|---|---|---|---|---|
| 2008/0266216 A1* | 10/2008 | Choi | ..................... | G09G 3/3258 345/77 |
| 2013/0166870 A1* | 6/2013 | Li | ....................... | G06F 13/1689 711/167 |
| 2018/0174517 A1* | 6/2018 | Lee | ...................... | G09G 3/3233 |

FOREIGN PATENT DOCUMENTS

| CN | 101510406 A | 8/2009 |
|---|---|---|
| CN | 103346793 A | 10/2013 |

(Continued)

*Primary Examiner* — Premal R Patel
(74) *Attorney, Agent, or Firm* — Hemisphere Law, PLLC; Zhigang Ma

(57) ABSTRACT

A voltage calibration method and a voltage system based on a timing controller are disclosed, wherein, the voltage calibration method comprises: the timing controller reads a voltage configuration value of a built-in non-volatile memory in a control chip; an analog-to-digital conversion chip acquires an output voltage of the control chip; the timing controller determines whether the output voltage is within a preset voltage range, and if not, updates the voltage configuration value in the built-in non-volatile memory until the output voltage is within the preset voltage range. The disclosure acquires the output voltage value of the control chip through the analog-digital conversion chip and automatically updates corresponding built-in non-volatile memories to automatically adjust the output voltage so as to (Continued)

ensure a stability of the output voltage and solve the problem of an output voltage drift.

10 Claims, 2 Drawing Sheets

(56) References Cited

FOREIGN PATENT DOCUMENTS

| CN | 103366706 A | 10/2013 |
| CN | 103915071 A | 7/2014 |
| CN | 104299556 A | 1/2015 |
| CN | 106528232 A | 3/2017 |

* cited by examiner

VOLTAGE CALIBRATION METHOD AND CALIBRATION SYSTEM BASED ON TIMING CONTROLLER

RELATED APPLICATIONS

The present application is a National Phase of International Application Number PCT/CN2018/073981, filed Jan. 24, 2018, and claims the priority of China Application No. 201711484040.8, filed Dec. 29, 2017.

FIELD OF THE DISCLOSURE

The disclosure relates to a data processing technical field, and more particularly to a voltage calibration method and voltage calibration system based on a timing controller.

BACKGROUND

With the development display technologies, flat display devices such as liquid crystal displays (LCDs) have been widely used in mobile phones, televisions, personal digital assistants, digital cameras, notebook computers, desktop computers and other consumer electronic products, which have become the mainstream in display devices, because of high quality, power saving, thin body and wide range of applications and other advantages.

See FIG. 1, a current liquid crystal display panel is usually driven by a TCON (Timing Controller) 10', the timing controller 10' is connected with a flash 20', and the power manage IC (PMIC chip) 30' and the programmable gamma chip (P-Gamma chip) 40' have a non-volatile memory (NVM), and the non-volatile memories in the power manage chip 30' and the programmable gamma chip 40' read the non-volatile memories in each chip to output a corresponding voltage.

However, due to a difference between the manufacturing process of the power manage chip and the programmable gamma chip and the difference of a peripheral circuit, a performance of a corresponding device and the performance of a peripheral circuit component will also decrease as a using time increases, even if their values of the non-volatile memory are the same, a voltage value output by different power manage chips and programmable gamma chips may also vary, resulting in a voltage drift and an unstable output voltage, sometimes a voltage range required by the timing controller or other devices may be exceeded, causing the timing controller or other devices not to function properly.

Therefore, in view of an above technical problem, it is necessary to provide a voltage calibration method and a calibration system based on a timing controller.

SUMMARY

In order to overcome the deficiencies of the prior art, a purpose of the present disclosure is to provide a voltage calibration method and a calibration system based on a timing controller to automatically calibrate the output voltage of an external chip and solve a problem of a voltage drift.

In order to realize the above purpose, an embodiment of the present disclosure provides the following technical solutions:

The voltage calibration method based on the timing controller, wherein, the voltage calibration method comprises:

Reading a voltage configuration value of a built-in non-volatile memory in a control chip by the timing controller;

Acquiring an output voltage of the control chip by an analog-to-digital conversion chip;

Determining whether the output voltage is within a preset voltage range by the timing controller, and if not, updating the voltage configuration value in the built-in non-volatile memory until the output voltage is within the preset voltage range.

As a further improvement of the present disclosure, the control chip comprises a power manage chip and/or a programmable gamma chip.

As the further improvement of the present disclosure, "updating the voltage configuration value in the built-in non-volatile memories" comprises:

If the output voltage is greater than a maximum value of the preset voltage range, the voltage configuration value in the built-in non-volatile memory is decreased by a preset amplitude; and/or If the output voltage is less than a minimum value of the preset voltage range, the voltage configuration value in the built-in non-volatile memory is increased by the preset amplitude.

As the further improvement of the present disclosure, the preset amplitude can be set as 1.

As the further improvement of the present disclosure, the voltage calibration method further comprises:

Storing the maximum value and the minimum value of the preset voltage range and a minimum accuracy of the analog-digital conversion chip corresponding to the control chip in advance.

Another embodiment of the present disclosure provides a technical solution as following:

The voltage calibration system based on the timing controller, wherein, the voltage calibration system comprises the timing controller, the plurality of control chips, the analog-digital conversion chip and a flash, wherein, A built-in non-volatile memory is provided on the control chip for storing a voltage configuration value of the control chip;

The analog-digital conversion chip is connected with an output end of the control chip for acquiring an output voltage of the control chip;

The timing controller is connected with the analog-to-digital conversion chip and the control chip, and is used for determining whether the output voltage is within a preset voltage range, and if not, updates the voltage configuration value in the built-in non-volatile memory;

The flash is connected with the timing controller for storing a control data of the timing controller.

As the further improvement of the present disclosure, the control chip comprises the power manage chip and/or the programmable gamma chip.

As the further improvement of the present disclosure, the flash is further used for storing the maximum value and the minimum value of the preset voltage range the minimum accuracy of the analog-digital conversion chip corresponding to the control chip.

As the further improvement of the present disclosure, the timing controller and the control chip and/or the analog-digital conversion chip perform a data transmission through an I2C bus.

As the further improvement of the present disclosure, the timing controller and the flash perform the data transmission through a SPI bus.

The disclosure acquires the output voltage value of the control chip through the analog-digital conversion chip and automatically updates corresponding built-in non-volatile memories to automatically adjust the output voltage so as to ensure a stability of the output voltage and solve the problem of an output voltage drift.

BRIEF DESCRIPTION OF THE DRAWINGS

To describe the technical solutions in the embodiments of the present disclosure or in the prior art more clearly, the following briefly introduces the accompanying figures required for describing the embodiments or the prior art; apparently, the accompanying figures in the following description show merely some embodiments of the present disclosure, and persons of ordinary skill in the art may still derive other figures from these accompanying figures without creative efforts and may also acquire other figures from these figures.

DETAILED DESCRIPTION OF PREFERRED EMBODIMENTS

In order to make those skilled in the art better understand the technical solutions in the present disclosure, the technical solutions in the embodiments of the present disclosure are dearly and completely described in the following with reference to the accompanying figures in the embodiments of the present disclosure. Apparently, the described embodiments are only a part but not all of the embodiments of the present disclosure. All other embodiments acquired by a person of ordinary skill in the art based on the embodiments of the present disclosure without creative efforts shall fall within the protection scope of the present disclosure.

Figure 1:
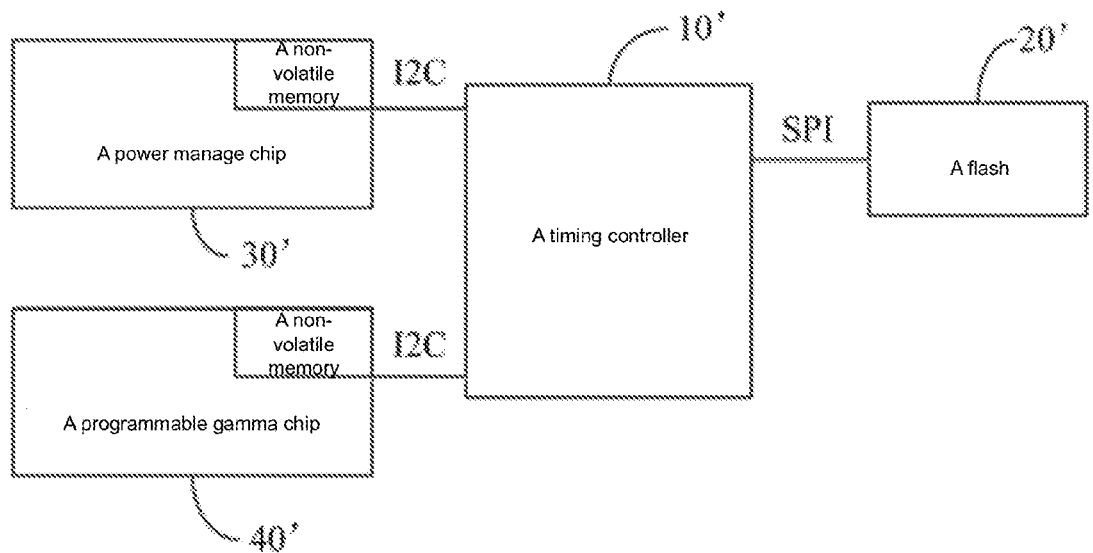
FIG. 1 is a timing controller working schematic view in a prior art.
Figure 2:
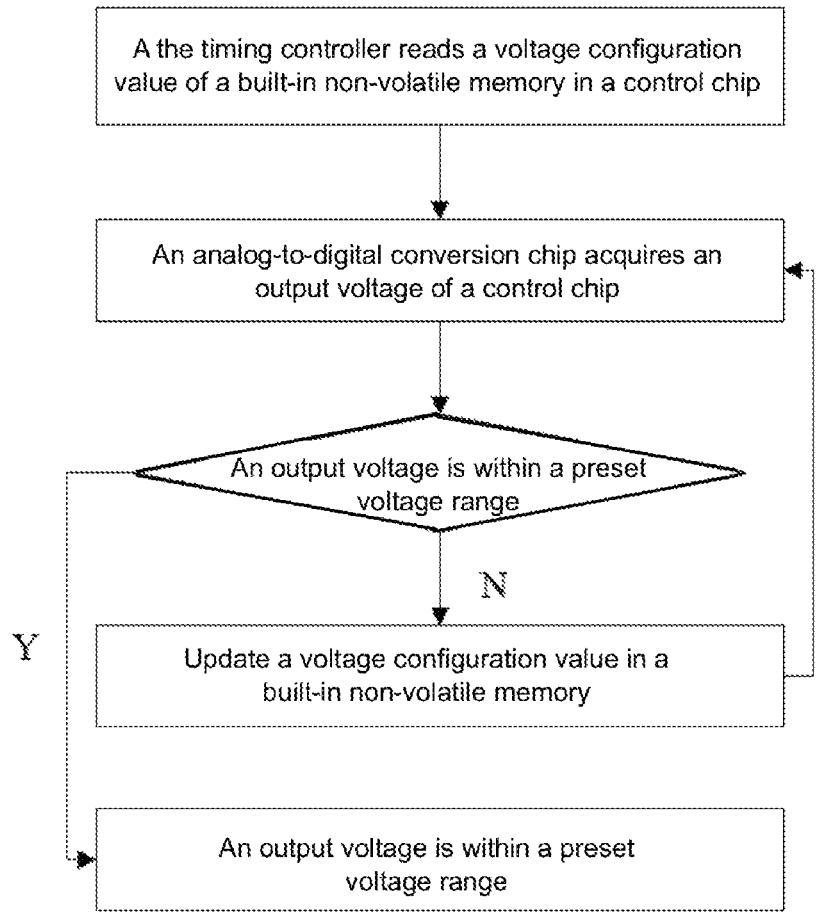
FIG. 2 is a flow chart of a voltage calibration method in the present disclosure.

See FIG. 2, a voltage calibration method based on a timing controller, wherein, the voltage calibration method comprises:

The timing controller reads a voltage configuration value of a built-in non-volatile memory in a control chip; the control chip may comprise, but is not limited to, a power manage chip (PMIC chip) and a programmable gamma chip (P-Gamma chip);

An analog-digital conversion chip (ADC chip) acquires an output voltage of the control chip;

The timing controller (TCON) determines whether the output voltage is within a preset voltage range, and if not, updates the voltage configuration value in the built-in non-volatile memory (NVM) until the output voltage is within the preset voltage range.

Wherein, "updating the voltage configuration value in the built-in non-volatile memory" comprises:

If the output voltage is greater than a maximum value of the preset voltage range, the voltage configuration value in the built-in non-volatile memory is decreased by a preset amplitude; and/or If the output voltage is less than a minimum value of the preset voltage range, the voltage configuration value in the built-in non-volatile memory is increased by the preset amplitude.

In a preferred embodiment of the present invention, the preset amplitude can be set as 1.

Preferably, the voltage calibration method further comprises:

Storing the maximum value and the minimum value of the preset voltage range and a minimum accuracy of the analog-digital conversion chip corresponding to the control chip in advance.

Accordingly, the present disclosure also discloses a voltage calibration system based on a timing controller, the voltage calibration system comprises the timing controller, the plurality of control chips, the analog-digital conversion chip and a flash, wherein, Providing the built-in non-volatile memory on the control chip for storing the voltage configuration value of the control chip;

Connecting the analog-digital conversion chip with an output end of the control chip for acquiring an output voltage of the control chip;

Connecting the timing controller with the analog-digital conversion chip and the control chip, and being used for determining whether the output voltage is within a preset voltage range, and if not, updates the voltage configuration value in the built-in non-volatile memory;

Connecting the flash with the timing controller o storing a control data of the timing controller.

Preferably, the timing controller and the control chip and/or the analog-digital conversion chip perform a data transmission through an I2C bus, and the timing controller and the flash perform the data transmission through a SPI bus.

It should be understood that, in FIG. 2, performing a step of "the timing controller reads the voltage configuration value of the built-in non-volatile memory in the control chip", and then performing the step of "the analog-digital conversion chip acquires the output voltage of the control chip", in other embodiments, the two steps may also be the opposite steps or may be implemented in the same step, and details are not described herein again.

The present disclosure will be further described with reference to specific embodiments.

An embodiment 1:

As shown in FIG. 2, the voltage calibration method based on the timing controller discloses in this embodiment comprises;

The timing controller reads a voltage configuration value of a built-in non-volatile memory (NVM) in the power manage chip (PMIC chip) and the programmable gamma chip (P-Gamma chip);

The analog-digital conversion chip acquires the output voltage of the power manage chip (PMIC chip) and the programmable gamma chip (P-Gamma chip);

Determining whether the output voltage of the power manage chip (PMIC chip) and the programmable gamma chip (P-Gamma chip) is within a preset voltage range, respectively, and if not, updates the voltage configuration value in the built-in non-volatile memory until the output voltage is within the preset voltage range.

In this embodiment, "updating the voltage configuration value in the built-in NVW" is specifically as follows:

If the output voltage of the power manage chip is greater than the maximum value of the preset voltage range of the power manage chip, the voltage configuration value in the built-in non-volatile memory of the power manage chip is reduced according to the preset amplitude (for example, which is 1); If the output voltage of the power manage chip is less than the minimum value of the preset voltage range of the power manage chip, the voltage configuration value in the built-in non-volatile memory of the power manage chip is increased according to the preset amplitude (for example, which is 1);

If the output voltage of the programmable gamma chip is greater than the maximum value of the preset voltage range of the programmable gamma chip, the voltage configuration value in the built-in non-volatile memory of the programmable gamma chip is reduced according to the preset amplitude (such as 1); If the output voltage of the programmable gamma chip is less than the minimum value of the preset voltage range of the programmable gamma chip the voltage configuration value in the built-in non-volatile memory of the programmable gamma chip is increased according to the preset amplitude (such as 1);

The analog-digital conversion chip is an analog-digital conversion device, its function is to convert an analog voltage into a digital, in this embodiment, the analog-digital conversion chip can acquire a specific output voltage after analog-digital converting each voltage output by the power manage chip and the programmable gamma chip, and compare the specific output voltage value with each preset voltage range, and thus perform the voltage calibration.

Preferably, before the voltage calibration in this embodiment, the method further comprises:

Storing the maximum value and the minimum value of the preset voltage range and the minimum accuracy of the analog-digital conversion chip corresponding to the power manage chip and the programmable gamma chip in advance.

Specifically, in this embodiment, the maximum value and the minimum value of the preset voltage range corresponding to an area storing the power manage chip and the programmable gamma chip, and the minimum accuracy of the analog-digital conversion chip are allotted in the flash.

When powering, an above data is read from the flash through the timing controller TCON, and the voltage configuration value of the built-in non-volatile memory (NVM) in the PMIC chip and the P-Gamma chip are read through an I2C interface.

Then, the timing controller TCON reads the output voltage of the PMIC chip and the P-Gamma chip in the analog-digital conversion chip through the I2C interface to determine whether each output voltage is between the maximum value and the minimum value of each preset voltage range, if not, then update the value of each built-in non-volatile memory (NVM), after a certain time (such as 1 ms), read the output voltage of the analog-digital conversion chip again, and then repeat the above steps until each output voltage is between the maximum value and the minimum value of the each preset voltage range.

Figure 3:
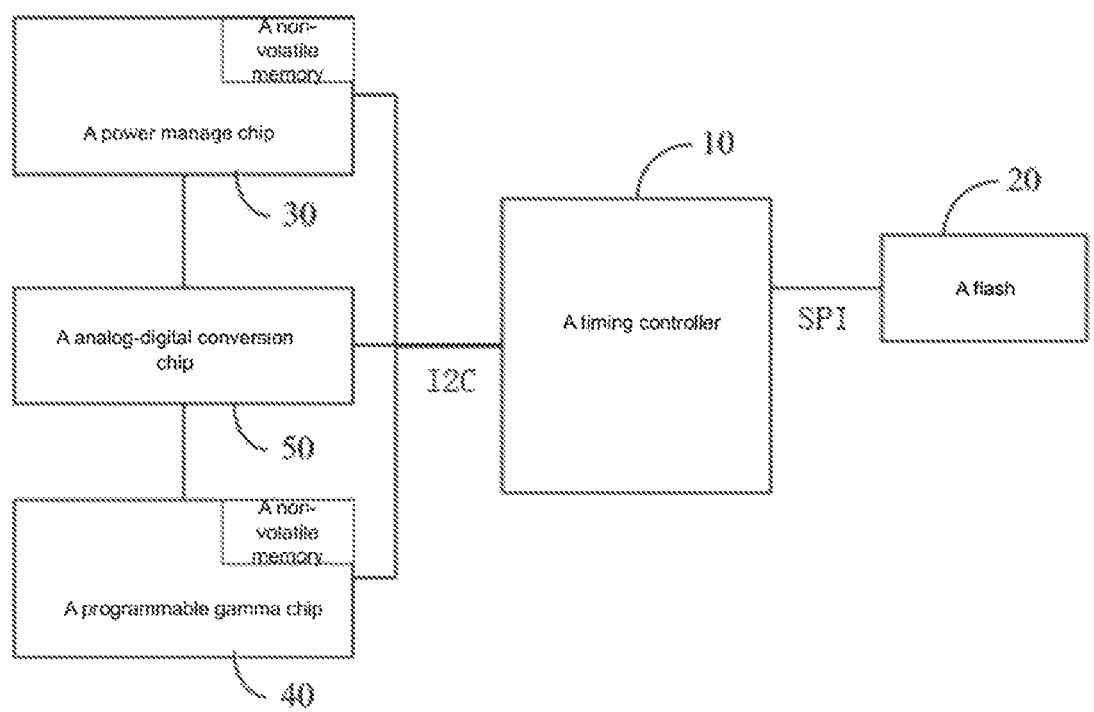
FIG. 3 is a module diagram of a voltage calibration system according to an embodiment of the present disclosure.

An embodiment 2:

As shown in FIG. 3, the voltage calibration system based on the timing controller discloses in this embodiment comprises the timing controller (TCON) 10, two control chips (the power manage chip 30 and the programmable gamma chip 40), the analog-digital conversion chip 50 and flash 20. Wherein:

The built-in non-volatile memories (NVM) are provided on the power manage chip 30 and the programmable gamma chip 40 for storing the voltage configuration value of the power manage chip 30 and the programmable gamma chip 40;

The analog-digital conversion chip 50 is connected with the output end of the power manage chip 30 and the programmable gamma chip 40 for acquiring the output voltage of the PMIC chip 30 and P-Gamma chip 40;

The timing controller (TCON) 10 is connected with the analog-to-digital conversion chip 50 and the control chip (the power manage chip 30 and the programmable gamma chip 40), and is used for determining whether the output voltage of the power manage chip 30 and the programmable gamma chip 40 is within the preset voltage range, and if not, updates the voltage configuration value in the built-in non-volatile memory until the output voltage of the power manage chip 30 and the programmable gamma chip 40 is within each preset voltage range.

The step of updating the voltage configuration value in the built-in non-volatile memory of the power manage chip 30 and the programmable gamma chip 40 is specifically as follows:

If the output voltage is greater than the maximum value of the preset voltage range of the power manage chip 30 and the programmable gamma chip 40, the voltage configuration value stored in the built-in non-volatile memory (NVM) is decreased by the preset amplitude (such as 1); and/or If the output voltage is less than the minimum value of the preset voltage range of the power manage chip 30 and the programmable gamma chip 40, the voltage configuration value stored in the built-in non-volatile memory (NVM) is increased by the preset amplitude (such as 1), Connecting the flash 20 with the timing controller 10 for storing a control data of the timing controller, at the same time, a part of the area in the flash 20 is used for storing the maximum value and the minimum value of the preset voltage range the minimum accuracy of the analog-digital conversion chip 50 corresponding to the power manage chip 30 and the programmable gamma chip 40.

In this embodiment, the timing controller 10, the power manage chip 30, the programmable gamma chip 40 and the analog-digital conversion chip perform a data transmission through an I2C bus, and the timing controller 10 and the flash 20 perform the data transmission through a SPI bus.

It should be understood that the chips in the above embodiments are described by taking the power manage chip and the programmable gamma chip for an example, in other embodiments which other kinds of chips may also be used, a data information stored in the flash is not limited to a parameter related to the power manage chip and the programmable gamma chip, and a stored data information is set according to the different chips, which the voltage calibration method and the calibration system are the same as those in the above embodiments, and will not be described in detail herein.

It can be seen from the above embodiments that the present disclosure acquires the output voltage value of the control chip through the analog-digital conversion chip and automatically updates corresponding built-in non-volatile memories to automatically adjust the output voltage so as to ensure a stability of the output voltage and solve the problem of an output voltage drift.

Any process or method descriptions that are otherwise described in a flow chart of the application or described herein may be understood as representing a module, a section or a portion of a code that comprises executable instructions that one or more steps for implementing a particular logical function or process, and a scope of the preferred embodiments of the present disclosure comprises additional implementations, which may not be in the order shown or discussed, comprises that performing the functions in substantially simultaneous manner or in the reverse order according to the functions involved, should be understood by those skilled in the art to which the embodiments of the disclosure pertain.

Logic and/or steps, which are represented in the flow chart or otherwise described herein, for example, may be thought of as a sequencing listing of executable instructions for implementing logic functions, which may be embodied in any computer-readable medium for use in connection with an instruction execution system, an apparatus, a device, or equipment (such as a computer-based system, a processor-included system, or other system that fetch instructions from an instruction execution system, the apparatus, or the device and execute the instructions). For the purposes of this specification, the "computer-readable medium" may be any apparatus that can contain, store, communicate, propagate, or transport a program for use in connection with the instruction execution system, the apparatus, or the device. More specific examples (a non-exhaustive list) of computer readable medium comprise the following: electrical connections (mobile terminals) with one or more wires, a portable computer disk cartridge (a magnetic device), a random access memory (RAM), a read only memory (ROM), an erasable programmable read only memory (EPROM or flash memory), an optical fiber devices, and a compact disc read only memory (CDROM). In addition, the computer-readable medium can even be a paper or other suitable medium on which the program can be printed as it can be done, for example, by an optical scanning of the paper or other medium, then editing, interpreting, or otherwise processed in any other suitable manner to electronically acquired the program and then stored in a computer memory.

It should be understood that various portions of the present disclosure may be implemented by a hardware, a software, a firmware, or a combination thereof. In the above embodiments, multiple steps or methods may be implemented in the software or the firmware stored in the memory and executed by a suitable instruction execution system. For example, if implemented in hardware, as in another embodiment, any of the following techniques known in the art or a combination thereof may be used: a discrete logic with a logic gate for implementing a logic function on a data signal, and an application specific integrated circuits with a suitable combinational logic gate, a programmable gate arrays (PGA), a field programmable gate arrays (FPGAs), and the like.

A person of ordinary skill in the art may understand that, all or part of the steps carried in the methods in the above embodiments may be implemented by a program instructing relevant hardware, and the program may be stored in a computer-readable storage medium, when being executed, the program comprises one of the steps of the method embodiments or a combination thereof.

In addition, each functional unit in the embodiments of the present disclosure may be integrated in one processing module, or each unit may exist alone physically, or two or more units may be integrated in one module. The above-mentioned integrated module can be implemented in a form of the hardware or in the form of the software functional module. When an integrated module is implemented in the form of a software function module and is sold or used as an independent product, the integrated module may also be stored in the computer readable storage medium.

The above-mentioned storage medium may be the read only memory, the magnetic disk, an optical disk, and so on. Although the embodiments of the present disclosure have been shown and described above, it should be understood that the above embodiments are exemplary and cannot be construed as limitations on the present disclosure, and persons skilled in the art may make variations, modifications, replacements, and variations on the above embodiments within the scope of the present disclosure.

It will be apparent to those skilled in the art that the disclosure is not limited to the details of the above exemplary embodiments, but that the present disclosure may be embodied in other specific forms without departing from the spirit or essential characteristics of the disclosure. Therefore, no matter the point of view, the embodiments should be regarded as exemplary and not limitative, the scope of the disclosure is defined by appended claims rather than an above description and it is intended to cover in the disclosure all the changes which come within a meaning and a range of equivalency of the claims. Any reference signs in the claims should not be construed as limiting the claim involved.

In addition, it should be understood that, although the specification is described according to the embodiments, not each embodiment comprises only one independent technical solution, and this description of the specification is merely for the sake of clarity and the technical personnel in a field should consider the specification as a whole, and the technical solutions in the embodiments may also be combined as appropriate to form other embodiments that can be understood by those skilled in the art.

What is claimed is:

1. A voltage calibration method based on a timing controller, wherein the voltage calibration method comprises:
   reading a voltage configuration value stored in a built-in non-volatile memory in a control chip by the timing controller;
   acquiring an output voltage of the control chip by an analog-to-digital conversion chip;
   determining whether the output voltage is within a preset voltage range by the timing controller, and if not, updating the voltage configuration value stored in the built-in non-volatile memory until the output voltage is within the preset voltage range, wherein the output voltage is different from the voltage configuration value, and the stored voltage configuration value is decreased when the output voltage is greater than the preset voltage range.

2. The voltage calibration method according to claim 1, wherein the control chip comprises a power manage chip and/or a programmable gamma chip.

3. The voltage calibration method according to claim 1, wherein updating the voltage configuration value in the built-in non-volatile memories comprises:
   if the output voltage is greater than a maximum value of the preset voltage range, the voltage configuration value in the built-in non-volatile memory is decreased by a preset amplitude; and/or
   if the output voltage is less than a minimum value of the preset voltage range, the voltage configuration value in the built-in non-volatile memory is increased by the preset amplitude.

4. The voltage calibration method according to claim 3, wherein the preset amplitude can be set as 1.

5. The voltage calibration method according to claim 3, wherein the voltage calibration method further comprises:
   storing the maximum value and the minimum value of the preset voltage range and a minimum accuracy of the analog-digital conversion chip corresponding to the control chip in advance.

6. A voltage calibration system based on a timing controller, wherein the voltage calibration system comprises the timing controller, a plurality of control chips, an analog-digital conversion chip and a flash, wherein
   a built-in non-volatile memory is provided on the control chip for storing a voltage configuration value of the control chip;

the analog-digital conversion chip is connected with an output end of the control chip for acquiring an output voltage of the control chip;

the timing controller is connected with the analog-to-digital conversion chip and the control chip, and is used for determining whether the output voltage is within a preset voltage range, and if not, updates the voltage configuration value in the built-in non-volatile memory;

the flash is connected with the timing controller for storing a control data of the timing controller, wherein the output voltage is different from the voltage configuration value, and the stored voltage configuration value is decreased when the output voltage is greater than the preset voltage range.

7. The voltage calibration system according to claim 6, wherein the control chip comprises a power manage chip and/or a programmable gamma chip.

8. The voltage calibration system according to claim 6, wherein the flash is further used for storing a maximum value and a minimum value of the preset voltage range and a minimum accuracy of the analog-digital conversion chip corresponding to the control chip.

9. The voltage calibration system according to claim 6, wherein the timing controller and the control chip and/or the analog-digital conversion chip perform a data transmission through an Inter-Integrated Circuit (I2C) bus.

10. The voltage calibration system according to claim 6, wherein the timing controller and the flash perform the data transmission through a Serial Peripheral Interface (SPI) bus.

* * * * *